US009153500B2

(12) United States Patent
Sun et al.

(10) Patent No.: US 9,153,500 B2
(45) Date of Patent: Oct. 6, 2015

(54) METHOD FOR IMPROVING THE ELECTROMIGRATION RESISTANCE IN THE COPPER INTERCONNECTION PROCESS

(75) Inventors: Qingqing Sun, Shanghai (CN); Lin Chen, Shanghai (CN); Wen Yang, Shanghai (CN); Pengfei Wang, Shanghai (CN); Wei Zhang, Shanghai (CN)

(73) Assignee: Fudan University, Shanghai (CN)

( * ) Notice: Subject to any disclaimer, the term of this patent is extended or adjusted under 35 U.S.C. 154(b) by 167 days.

(21) Appl. No.: 13/528,474

(22) Filed: Jun. 20, 2012

(65) Prior Publication Data

US 2013/0078798 A1    Mar. 28, 2013

(30) Foreign Application Priority Data

Sep. 23, 2011  (CN) .......................... 2011 1 0285221

(51) Int. Cl.
| | |
|---|---|
| *H01L 21/44* | (2006.01) |
| *H01L 21/8238* | (2006.01) |
| *H01L 23/532* | (2006.01) |
| *H01L 21/768* | (2006.01) |

(52) U.S. Cl.
CPC .. *H01L 21/823871* (2013.01); *H01L 21/76805* (2013.01); *H01L 21/76843* (2013.01); *H01L 21/76849* (2013.01); *H01L 21/76856* (2013.01); *H01L 21/76867* (2013.01); *H01L 23/53238* (2013.01); *H01L 21/76855* (2013.01); *H01L 21/76858* (2013.01); *H01L 21/76865* (2013.01); *H01L 2924/0002* (2013.01)

(58) Field of Classification Search
CPC ................... H01L 21/76843; H01L 21/76849; H01L 21/7685; H01L 21/76855; H01L 21/76856; H01L 21/76858
USPC .................. 438/653, 658, 660, 661; 257/767
See application file for complete search history.

(56) References Cited

U.S. PATENT DOCUMENTS

| | | | | |
|---|---|---|---|---|
| 5,420,069 | A * | 5/1995 | Joshi et al. | 438/652 |
| 2004/0207093 | A1 * | 10/2004 | Sun et al. | 257/765 |
| 2006/0163732 | A1 * | 7/2006 | Cunningham | 257/751 |
| 2007/0194450 | A1 * | 8/2007 | Tyberg et al. | 257/751 |
| 2008/0136029 | A1 * | 6/2008 | Liu et al. | 257/751 |
| 2008/0213997 | A1 * | 9/2008 | Lee et al. | 438/653 |
| 2009/0278259 | A1 * | 11/2009 | Kouno et al. | 257/751 |

* cited by examiner

*Primary Examiner* — Kimberly Rizkallah
*Assistant Examiner* — Maria Ligai
(74) *Attorney, Agent, or Firm* — Jenkins, Wilson, Taylor & Hunt, P.A.

(57) ABSTRACT

The present invention belongs to the technical field of integrated semiconductor circuits, and relates to a method used in a process no greater than 32 nm to improve the electromigration resistance of Cu interconnects. Coating layers on Cu interconnects, such as $CuSi_3$, CuGe, and CuSiN, can be prepared by autoregistration, and with the use of new impervious layer materials, the electromigration resistance of Cu interconnects can be largely improved and the high conductivity thereof can be kept, which provides an ideal solution for interconnection process for process nodes no greater than 32 nm.

2 Claims, 4 Drawing Sheets

METHOD FOR IMPROVING THE ELECTROMIGRATION RESISTANCE IN THE COPPER INTERCONNECTION PROCESS

CROSS-REFERENCE TO RELATED APPLICATION

This application is a continuation of and claims priority to Chinese Patent Application No. CN201110285221.4 filed on Sep. 23, 2011, the entire content of which is incorporated by reference herein.

BACKGROUND OF THE INVENTION

1. Technical Field

The present invention belongs to the technical field of integrated semiconductor circuits, and relates to a method for improving the electromigration resistance in the Copper interconnection process.

2. Description of Related Art

With the continuous size reduction of semiconductor devices and the continuous enlargement of the chip area, people are faced with the problem of how to solve the remarkably increased delay of the RC (R stands for resistance and C for capacitance) caused by the rapid growth of the wiring length, which has been a critical constraint on the development of the semiconductor industry. To reduce the RC delay caused by the interconnection, a lot of measures have been taken.

Compared with conventional aluminum, copper has the following advantages: firstly, copper has a smaller resistivity (Cu: 1.7μΩ/cm, Al: 3μΩ/cm). Secondly, Cu interconnects have smaller parasitic capacitance than Al interconnects. Because of Cu's smaller resistivity and better conductivity, when both copper and aluminum withstand the same current, Cu interconnects have smaller cross sectional area than the Al interconnects, so the parasitic capacitance among adjoining conducting wires is smaller. Therefore, the signal interference is smaller. Since the time parameter RC of Cu interconnects are smaller than that of Al interconnects, signals on Cu interconnects transmit faster than that on Al interconnects, which benefits the high-speed IC. Thirdly, the smaller resistance of the Cu interconnects leads to smaller power consumption than that of Al interconnects. Fourthly, the electromobility resistance of copper is better than that of Al (Cu<$10^7$ A/cm$^2$, Al<$10^6$ A/cm$^2$), so no interconnect voids caused by electromigration will be produced, which improves the reliability of devices. As a result, it is more reliable for devices to use Cu as the interconnect metal. At present, the best integrated circuit interconnect system is the Cu/low-k dielectric interconnect system which, compared with conventional interconnect systems, has more advantages, such as less layers of metal interconnects, higher speed of chips, lower power consumption, lower cost and higher electromigration resistance.

However, with the continuous size reduction of semiconductor devices, Cu/low-k dielectric interconnect systems have more requirements for copper's electromigration resistance. Preparing a silicide coating layer on Cu interconnects is an effective method to solve the problem of anti-electromobility, but under high temperature, the extremely high diffusion coefficient of silicon in copper will lead to a large increase in the resistance of interconnects, which makes the right choice of coating layers and the development of a proper interconnection process a problem in bad need of a solution.

BRIEF SUMMARY OF THE INVENTION

The present invention aims at providing a proper method to manufacture coating layers of Cu interconnects so that the electromigration resistance of Cu interconnects can be improved without increasing the resistance of interconnects.

The method for improving the electromigration resistance of Cu interconnects provided by the present invention includes the following steps:

provide a semiconductor substrate;
prepare a preceding MOS devices through the regular standard CMOS process;
form a first insulating dielectric layer;
define the interconnect position through photoetching and etching;
form a diffusion impervious layer;
form Cu interconnects;
prepare coating layers on Cu interconnects;
the etching part is used in the coating layers on the Cu interconnects for follow-up interconnection;
prepare the coating layers on the follow-up formed Cu interconnects.

Further, the first insulating dielectric layer is composed of low-k dielectric materials such as silicon oxide, silicon nitride or FSG.

Furthermore, the specific steps of preparing the coating layers on the Cu interconnects are:

form a first material layer on Cu interconnects;
form coating layers of copper contained compound by high temperature annealing;
etch away the remaining first material layer.

Wherein, the first material is silicon or germanium.

Furthermore, to improve the performance, after the formation of the coating layers of copper-containing compounds on Cu interconnects, the new coating layers of nitrogen and copper-containing compounds shall be formed through the nitrogenization process.

DETAILED DESCRIPTION OF THE INVENTION

Figure 1:
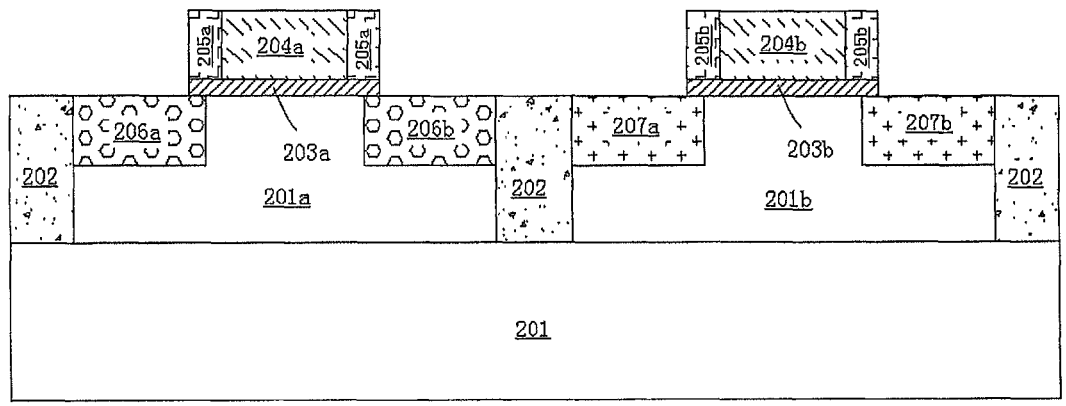
FIG. 1 to FIG. 8 are the process flow diagrams of preparing CMOS devices through the method for improving the electromigration resistance of Cu interconnects provided by the present invention.

The present invention is further detailed in combination with the drawings and the embodiments below. In the drawings, the thickness of layers and regions are either zoomed in or out for the convenience of description, so it shall not be considered as the true size. Although the drawings cannot accurately reflect the true size of the devices, they still reflect the relative position among regions and composition structures, especially the up-down and adjacent relations. The reference diagrams are the schematic diagrams of the idealized embodiments of the present invention, so the embodiments shown in the present invention shall not be limited to specific shapes in areas shown in the drawings, while they shall include the obtained shapes such as the deviation caused by manufacturing. For instance, curves obtained through etching are often bent or rounded, while in the embodiments of the present invention, they are all presented in rectangles, and what the drawings present is schematic and shall not be considered as the limit to the present invention. Meanwhile, the term "Substrate" used in the following description can be considered as a semiconductor substrate during the manufacturing process, and other film layers prepared on it can also be included.

The method for improving the electromigration resistance of the Cu interconnects provided by the present invention are suitable for back end interconnection of different MOS devices, and the following description is an embodiment of the process flow which takes the preparation of CuSiN coating layers of Cu interconnects of CMOS devices in a 22 nm process.

First of all, provide a semiconductor substrate 201, and then finish the preceding CMOS devices' preparation through the standard CMOS process, as shown in FIG. 1, wherein the specific process includes: 1. form a swallow-slot isolation structure 202 in a substrate 201, which is well known in the technical field; 2. form an n-trap 201a and a p-trap 201b in the substrate 201 through diffusion process or ion implantation process; 3. form a gate oxide layer 203a, a gate electrode 204a and a gird side wall 205a of PMOS devices, and a gate oxide layer 203b, a gate electrode 204b and a gird side wall 205b of NMOS devices on the substrate 201 through oxidation process, film deposition process as well as photoetching and etching; 4. form a source region 206a and a drain region 206b of PMOS devices, and a source region 207a and a drain region 207b (the contact of metals and semiconductors) of NMOS devices through diffusion process or ion implantation process to finish the preceding manufacturing process of CMOS devices.

Figure 2:
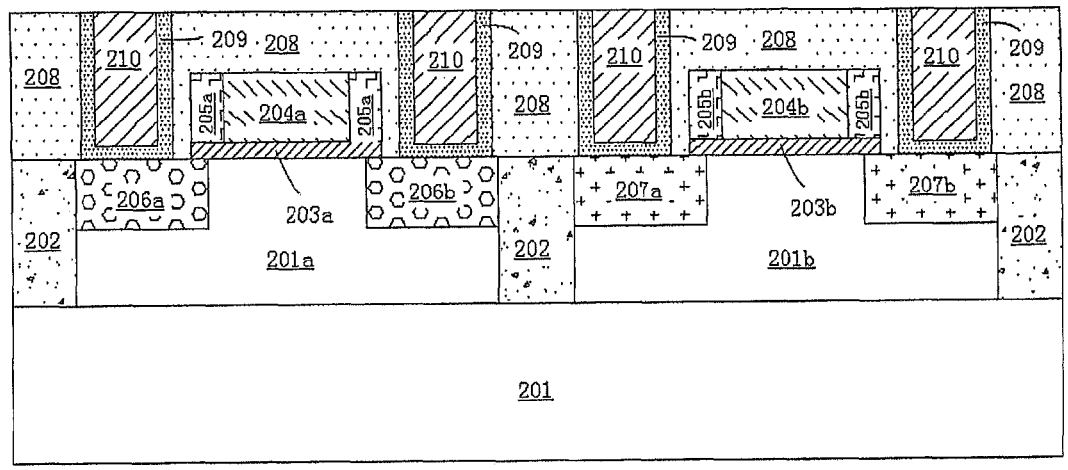

Next, deposit SiOC low-k dielectric materials to form the interbedded isolation layer 208 through chemical vapor deposition (CVD), define interconnect hole position through photoetching and etching, sputter a layer of TiN through reaction ions to be used as copper's diffusion impervious layer, and then grow a Ru layer on TiN through atomic layer deposition (ALD) to form an Ru/TiN composition 209, afterwards, form a Cu interconnect 210 through electroplating and level the surface of wafer through chemically mechanical polishing (CMP), as shown in FIG. 2.

Figure 3:
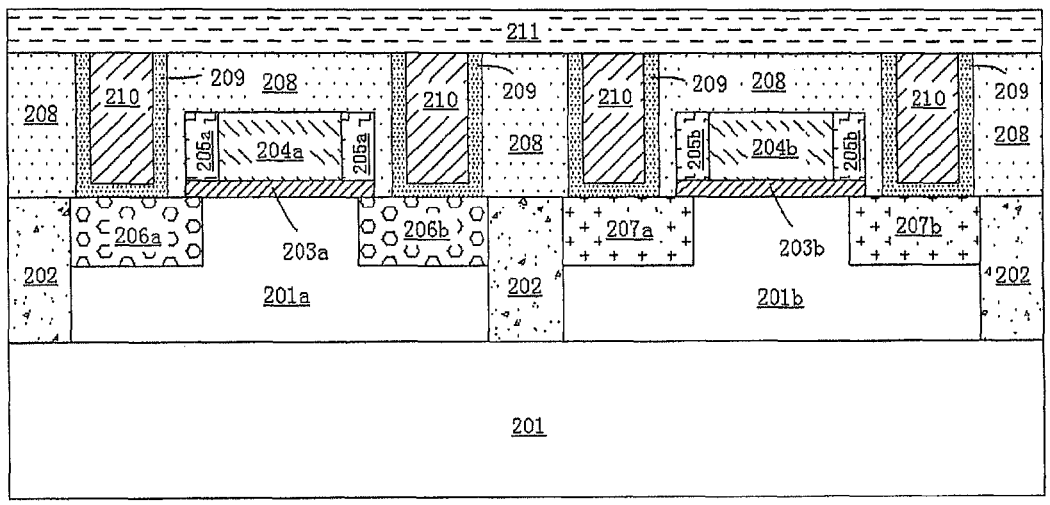
Figure 4:
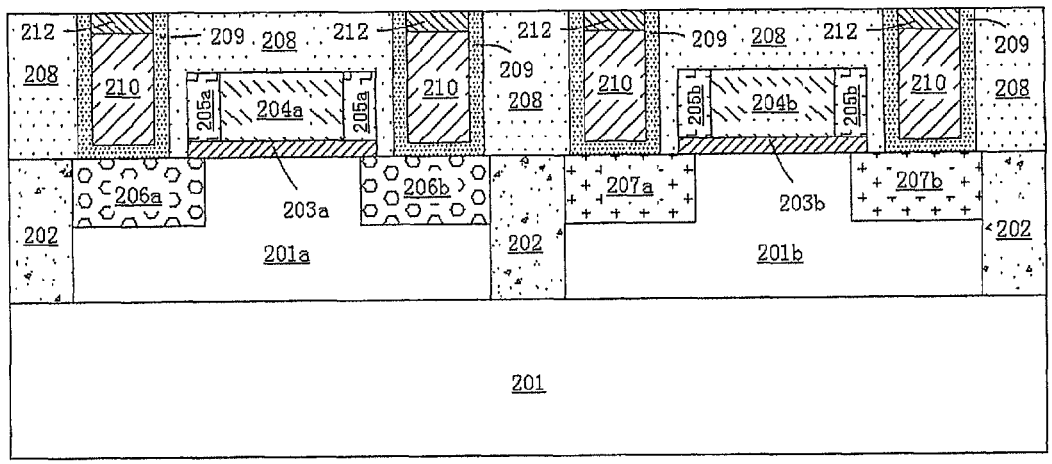

Next, as shown in FIG. 3, use $SiH_4$ as the precursor of CVD to form a silicon layer 211 on wafer. Afterwards, form copper silicide through annealing, etch the remaining silicon layer, and form a CuSiN compound coating layer 212 on the surface of the Cu interconnect 210 after the treatment of $NH_3$ by plasma, as shown in FIG. 4.

Figure 5:
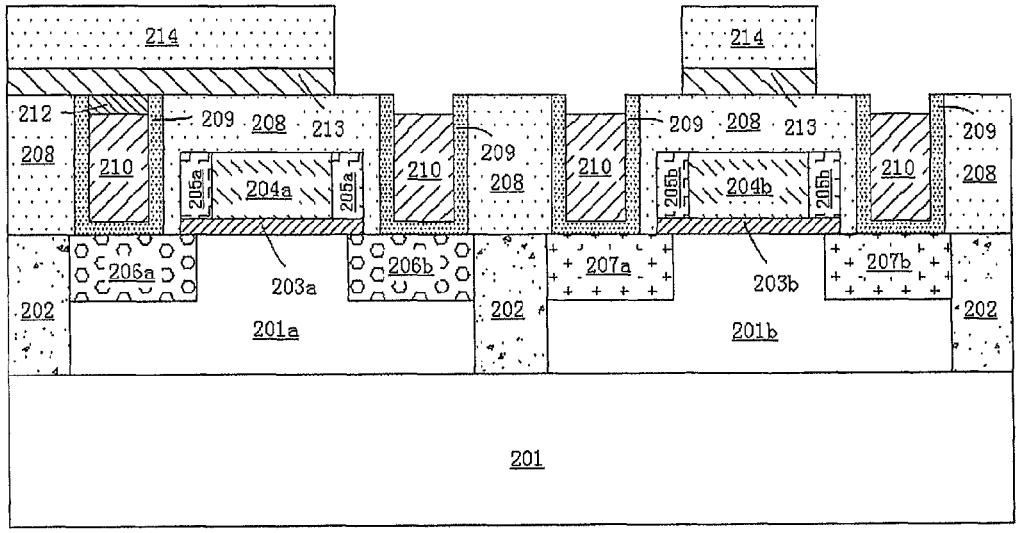

Next, deposit a layer of silicon nitride, etching impervious layer 213, and deposit an SiOC interbedded isolation layer 214 again, and then define the second interconnection position through photoetching and etching, and etch away part of the CuSiN coating layer 212 selectively to reduce the resistance of the Cu interconnects for follow-up interconnection, as shown in FIG. 5.

Figure 6:
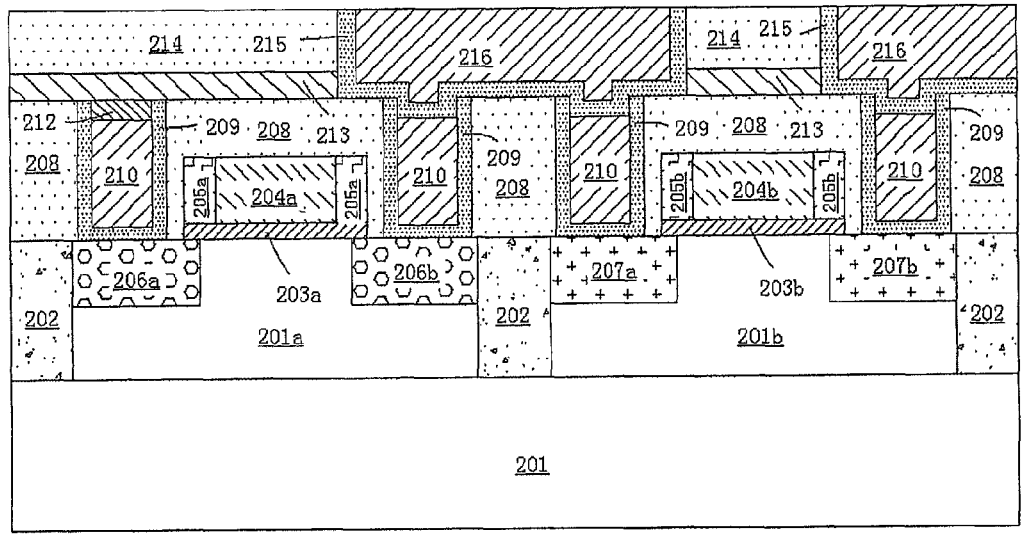

Next, form an Ru/TiN diffusion impervious layer 215 through depositing, electroplate a Cu interconnect 216, and then use the CMP process to conduct the polishing, as shown in FIG. 6.

Figure 7:
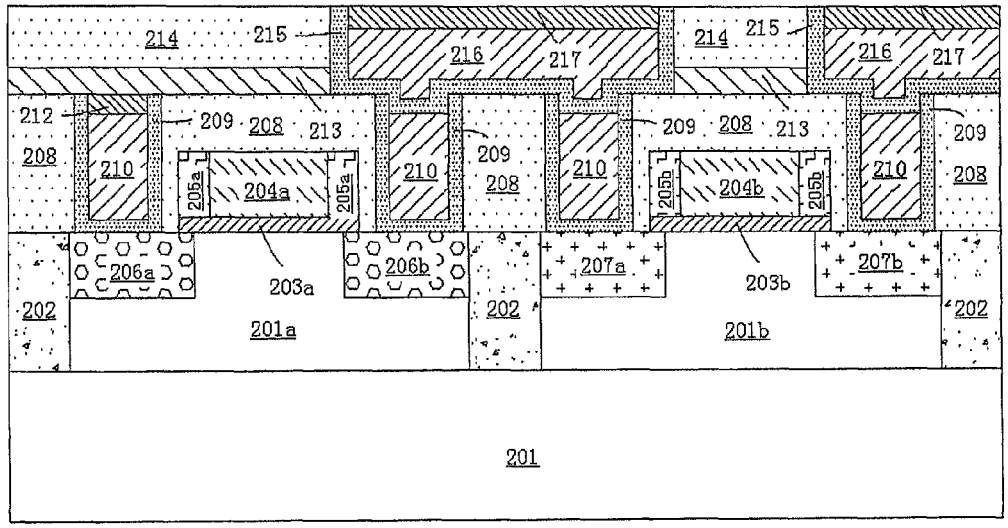

Afterwards, form a coating layer of CuSiN compound 217 on the second Cu interconnect 216, as shown in FIG. 7.

Figure 8:
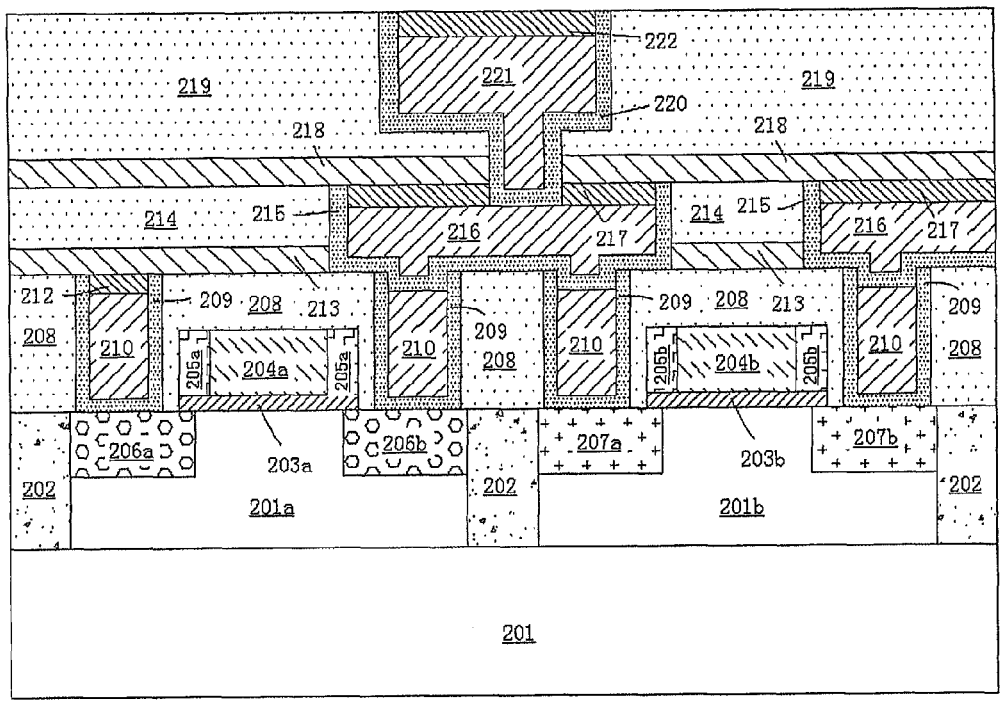

In the end, form Cu interconnects for follow-up interconnection through a dual damascene, and form a CuSiN compound coating layer 222 of Cu interconnects through the process which is used to form CuSiN, as shown in FIG. 8, wherein, the 218 is silicon nitride etching the impervious layer, the 219 is FSG low-k dielectric material, the 220 is the diffusion impervious layer of Ru/TiN composition, and the 221 is Cu interconnects.

As described above, without deviating from the spirit and scope of the present invention, there may be many significantly different embodiments. It shall be understood that the present invention is not limited to the specific embodiments described in the Specification except those limited by the Claims herein.

What is claimed is:

1. A method for improving electromigration resistance of Cu interconnects, comprising:
   providing a semiconductor substrate;
   finishing preparation of preceding metal-oxide-semiconductor (MOS) devices through a regular complementary metal-oxide-semiconductor (CMOS) process;
   forming a first insulating dielectric layer;
   defining an interconnect position through photoetching and etching;
   forming a diffusion impervious layer;
   forming Cu interconnects;
   preparing coating layers on the Cu interconnects, wherein preparing coating layers comprises:
      forming a germanium layer on the Cu interconnects;
      forming coating layers of copper-containing compounds through high temperature annealing; and
      etching away the remaining germanium layer;
   etching part of the coating layers on the Cu interconnects for follow-up interconnection;
   forming the follow-up Cu interconnection through dual damascene;
   preparing second coating layers on the follow-up formed Cu interconnects.

2. The method for improving the electromigration resistance of Cu interconnects according to claim 1, wherein, after the formation of the coating layers of copper-containing compounds on the Cu interconnects, new coating layers of nitrogen and copper-containing compounds are formed through a nitrogenization process.

* * * * *